United States Patent [19]
Kim et al.

[11] Patent Number: 6,051,678
[45] Date of Patent: *Apr. 18, 2000

[54] COPOLYMERS CONTAINING N-VINYLLACTAM DERIVATIVES, PREPARATION METHODS THEREOF AND PHOTORESISTS THEREFROM

[75] Inventors: Jin Baek Kim; Min Ho Jung, both of Seoul; Jong Ho Cheong, Cheongju-Si, all of Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/816,305

[22] Filed: Mar. 13, 1997

[30] Foreign Application Priority Data

Dec. 20, 1996 [KR] Rep. of Korea ........................ 96-68910

[51] Int. Cl.[7] ............................. C08G 69/14; C08F 26/10
[52] U.S. Cl. ........................ 528/323; 525/526.9; 540/200; 540/354; 540/358; 540/252; 540/463; 540/451; 540/485; 540/487; 540/524; 540/525; 540/326; 540/531; 546/14; 546/21; 546/243; 548/111; 548/544; 548/545; 548/557; 430/281.1
[58] Field of Search ........................ 528/323; 525/326.9; 540/200, 354, 358, 252, 463, 451, 485, 487, 524, 525, 526, 531; 546/14, 21, 243; 548/111, 544, 545, 551; 430/281.1

[56] References Cited

U.S. PATENT DOCUMENTS

| 4,164,614 | 8/1979 | Ames | 526/264 |
|---|---|---|---|
| 4,456,741 | 6/1984 | Ames | 526/264 |
| 4,491,628 | 1/1985 | Ito et al. | 430/176 |
| 5,750,680 | 5/1998 | Kim et al. | 540/200 |

FOREIGN PATENT DOCUMENTS

| 0 091 039 | 10/1983 | European Pat. Off. . |
|---|---|---|
| 0528203 | 2/1993 | European Pat. Off. . |
| 45-025706 | 8/1970 | Japan . |
| 51-082387 | 7/1976 | Japan . |
| 55-003495 | 1/1980 | Japan . |
| 63-175085 | 7/1988 | Japan . |
| 2-214710 | 8/1990 | Japan . |
| 6-003822 | 1/1994 | Japan . |
| 6-025577 | 1/1994 | Japan . |
| 9-216867 | 8/1997 | Japan . |
| 2 012 285 | 7/1979 | United Kingdom . |

*Primary Examiner*—Duc Truong
*Attorney, Agent, or Firm*—Nath & Associates; Gary M. Nath

[57] ABSTRACT

Copolymers containing N-vinyllactam derivatives protected at 3-position are provided and represented by the following formula. The copolymers are used as a photoresist material suitable for deep uv process so that high sensitivity and resolution can be obtained. In addition, ultrafine circuits can be formed and an exceptional improvement in PED stability can be accomplished by use of the photoresist.

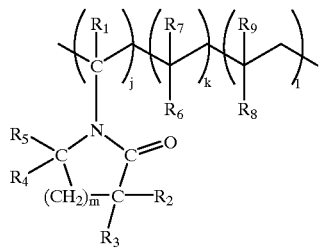

14 Claims, No Drawings

COPOLYMERS CONTAINING N-VINYLLACTAM DERIVATIVES, PREPARATION METHODS THEREOF AND PHOTORESISTS THEREFROM

BACKGROUND OF THE INVENTION

1. Field of the invention

The present invention relates to copolymers containing N-vinyllactam derivatives for use in microlithography, methods for preparing the same and photoresists prepared from the same. More particularly, the present invention is concerned with copolymers containing N-vinyllactam derivatives protected at 3-position, methods for preparing the copolymers, and photoresists suitable for deep uv exposure, which takes advantage of the radiation sensitivity of the copolymer to form a relief image of high sensitivity and resolution by use of deep uv.

2. Description of the Prior Art

Generally, a photoresist comprises an alkali-soluble phenol- (or cresol-) formaldehyde novolak resin and a substituted naphthoquinone diazine compound as a photosensitive material (photoactive ingredient), as reported in U.S. Pat. Nos. 3,666,473, 4,115,128 and 4,173,470.

While the novolak resin used in such photoresist is dissolved in an aqueous alkali solution, the naphthoquinone photosensitive material acts as a dissolution inhibitor of the resist. However, when a substrate coated with the photoresist is selectively subjected to chemical radiation, the photosensitive agent is induced to be suffered from such a structural modification that the photoresist coating is more solubilized by alkali at exposed region than at unexposed region. By virtue of such difference in solubility, a relief pattern can be formed on the coating of the substrate. That is, when the substrate is immersed in an alkaline developing solution, while the unexposed region is little affected, the exposed region of the photoresist coating is dissolved, forming a pattern. However, the above-mentioned novolak type resists were found to be unsuitable to the stepper utilizing shorter wavelength, which will be described later, because they show high optical absorbance in a range of deep ultraviolet light, 200 to 300 nm.

In order to accomplish high sensitivity in the lithography process of semiconductor manufacture, chemical amplification resist has recently been developed. Indeed, the chemical amplification resist has been in the limelight since it was found to have the capacity to increase sensitivity 100-fold more comparing with conventional positive novolak resists. A chemical amplification resist, which takes advantage of the photoacid generator, is generally prepared by formulating the photoacid generator in a matrix polymer of a structure sensitively reacting to the acid. For the mechanism of the photoreaction, when the photoacid generator is exposed to light or irradiated by a high energy beam, such as X-ray beams, and electron beams, protons and strong Bronsted acid, are generated, causing the main chain or the side chain of the matrix polymer to react toward decomposition, crosslinking or a large change in polarity. This action of the acid induces, at the irradiated region, the solubility therein in the given developing solution to be altered, that is, increased or decreased. As a result, fine patterns can be formed.

As the photoacid generators, onium salts which are able to respond to light and radiation are known. Typical onium salts are ammonium salts, oxonium salts and sulfonium salts. Recently, it has been reported that organic sulfonic ester can function as a photoacid generator.

Available for the matrix polymer which can react with acid are those which are substituted a side chain which can be decomposed into carboxylic acid, phenol or alcoholic functional group by acid. T-Butylester, t-butylcarbonate, t-butoxy and t-butoxycarbonyl groups are known as the suitable substituents. Among these groups, t-butoxycarbonyl group is found to be best in sensitivity.

Such an acid-reactive polymer in a protected state or prior to reaction with acid, can be dissolved in organic solvent but not in alkali aqueous solution. However, if the acid-reactive polymer is deprotected by reaction with acid, it is soluble in alkali aqueous solution because its polarity is largely changed.

Taking advantage of this principle, the development of chemical amplification resists has been a controversial hot issue in recent years. T-Butoxycarbonyl-protected polyvinylphenol is reported to be one of the possible resins, as introduced in U.S. Pat. Nos. 4,491,628, 4,405,708 and 4,311,782.

A recent trend in submicrolithography is to use deep uv (wavelength 200 to 300 nm) as a light source, preferably, a KrF excimer laser of high power (wavelength 248), rather than conventional uv, e.g. g-line (wavelength 436 nm) or i-line (wavelength 365 nm), in order to accomplish high sensitivity and resolution. However, the chemical amplification resists are readily contaminated by the base materials present in air, raising a problem of stability in the post-exposure delay (hereinafter referred to as "PED") at which T-top is formed on the course of fine pattern formation.

Various methods have been suggested to improve the PED stability. Among these methods, use of base additives (mainly amines) was found to bring an improvement in PED stability, but was disadvantageous in that it caused a decrease in radiation-sensitivity of photoresist and the base additives were not uniformly distributed in film because of their diffusion into the film surface during processing.

SUMMARY OF THE INVENTION

Intensive research performed by the present inventors aiming to develop a photoresist for use in submicrolithography which is much improved in PED stability resulted in the finding that the chemical amplification resist polymerized with N-vinyllactam derivatives and styrenic or acrylate derivatives has high glass transition temperatures necessary for processing procedure, and is easily deprotected with little absorption of deep uv in addition to being superior in PED stability.

It is a principal object of the present invention to provide a copolymer containing a N-vinyllactam derivative which is blocked at 3-position by a protecting group.

It is another object of the present invention to provide a method for preparing the copolymer.

It is a further object of the present invention to provide a photoresist prepared from the copolymer.

DETAILED DESCRIPTION OF THE INVENTION

The present invention related to copolymers containing N-vinyllactam derivatives which are substituted with a protecting group at 3-position, represented by the following chemical formula I:

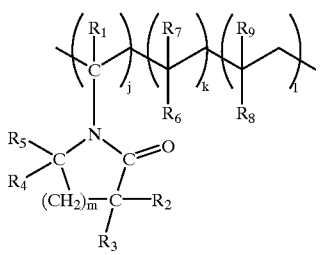

wherein, $R_1$ is hydrogen, an alkyl group containing 1 to 10 carbon atoms, an aryl group containing 6 to 12 carbon atoms or a trialkylsilyl group containing 3 to 9 carbon atoms;

$R_2$ and $R_3$ independently represent hydrogen, an alkyl group containing 1 to 10 carbon atoms, an aryl group containing 6 to 12 carbon atoms, a trialkylsillyl group containing 3 to 9 carbon atoms, —OR', —SO$_3$R', —CO$_2$R', —PO$_3$R', —SO$_2$R'or PO2R'wherein R'is an alkyl group containing 1 to 10 carbon atoms, cycloalkyl, a cyclic group containing a heteroatom such as N, O, P and S, or an aryl group containing 6 to 12 carbon atoms;

$R_4$ and $R_5$ independently represent —OH, —OR wherein R is an alkyl group containing 1 to 10 carbon atoms or an aryl group containing 6 to 12 carbon atoms, or the same with $R_1$;

$R_7$ and $R_9$ independently represent hydrogen, an alkyl group containing 1 to 10 carbon atoms, an aryl group containing 6 to 12 carbon atoms, or a trialkylsillyl group containing 3 to 9 carbon atoms;

$R_6$ and $R_8$ independently represent an aryl group containing 6 to 20 carbon atoms or an acrylate —COOR" (wherein R" is an alkyl group containing 1 to 10 carbon atoms or an aryl group containing 6 to 12 carbon atoms);

m is an integer of 0 to 10;

j is a molar ratio ranging from 0.005 to 0.7; and k and 1, which may be the same or different, each are a molar ratio ranging from 0.05 to 0.9.

The N-vinyllactam derivatives of the present invention are represented by the following chemical formula II:

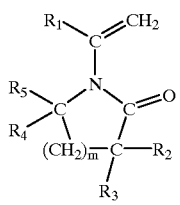

wherein, $R_1$ is hydrogen, an alkyl group containing 1 to 10 carbon atoms, an aryl group containing 6 to 12 carbon atoms or a trialkylsilyl group containing 3 to 9 carbon atoms;

$R_2$ and $R_3$ independently represent hydrogen, an alkyl group containing 1 to 10 carbon atoms, an aryl group containing 6 to 12 carbon atoms, a trialkylsilyl group containing 3 to 9 carbon atoms, or —OR', —SO$_3$R', —CO$_2$R', —PO$_3$R', —SO$_2$R' or PO$_2$R' wherein R' is an alkyl group containing 1 to 10 carbon atoms, cycloalkyl a cyclic group containing a heteroatom such as N, O, P and S, or an aryl group containing 6 to 12 carbon atoms;

$R_4$ and $R_5$ independently represent —OH, —OR wherein R is an alkyl group containing 1 to 10 carbon atoms or an aryl group containing 6 to 12 carbon atoms, or the same with $R_1$; and m is an integer of 0 to 10.

A copolymer in the present invention is prepared by polymerizing N-vinyllactam derivatives with styrenic or acrylate derivatives.

Concrete examples of the N-vinyllactam derivatives used in the present invention include 1-vinyl-2-pyrrolidinone, 1-vinyl-4-butyl-2-pyrrolidinone, 1-vinyl-4-propyl-2-pyrrolidinone, 3-(t-butoxycarbonyl)-1-vinyl-2-pyrrolidinone, 3-(t-butoxycarbonyl)-1vinyl-4-butyl-2-pyrrolidinone, 3-(t-butoxycarbonyl)-1-vinyl-4-propyl-2-pyrrolidinone, 3-(tetrahydropyranyloxycarbonyl)-1-vinyl-5-ethyl-2-pyrrolidinone, 1-vinyl-4-methyl-2-piperidone, 1-vinyl-5ethyl-2-piperidone, 3-(t-butoxycarbonyl)-1-vinyl-4methyl-2-piperidone, 3-(t-butoxycarbonyl)-1-vinyl-4-propyl-2-piperidone, 1-vinyl-2-caprolactam, 1-vinyl-4-butyl-2-caprolactam, 3-(t-butoxycarbonyl)-1-vinyl-2-caprolactam, 3-(t-butoxycarbonyl)-1-vinyl-4-butyl-2-caprolactam, 3-(t-butoxycarbonyl)-1-vinyl-6-methyl-2-caprolactam, 3-(tetrahydropyranyloxycarbonyl)-1-vinyl-5-butyl-2-caprolactam, 3-tetrahydropyranyloxycarbonyl)-1-vinyl-6-propyl-2-caprolactam, 3-(tetrahydrofuranyloxycarbonyl)- 1-vinyl-2-pyrrolidinone, 3-(tetrahydrofuranyloxycarbonyl)-1-vinyl-4-butyl-2-pyrrolidinone, and 3-(tetrahydropyranyloxycarbonyl)1-vinyl-6-butyl-2-caprolactam.

For copolymer, another monomer is used the examples of which include 4-(t-butoxycarbonyloxy)-1-vinylcyclohexane, 3,5-(di-t-butoxycarbonyloxy)-1-vinylcyclohexane, 4-(tetrahydropyranyloxy)-1-vinylcyclohexane, 4-(tetrahydrofuranyloxy)-1-vinylcyclohexane, 3,5-(ditetrahydropyranyloxy)-1-vinylcyclohexane, 3,5-(ditetrahydrofuranyloxy)-1-vinylcyclohexane, t-butoxycarbonyloxystyrene, styrene, tetrahydropyranyloxystyrene, 4-hydroxystyrene, 4-acetoxystyrene, 3-methyl-4-hydroxystyrene, t-butyl acrylate, t-butyl methacrylate, adamantylacrylate, and adamantylmethacrylate.

The copolymers of the present invention may be obtained in bulk polymerization or in a solution polymerization. As a solvent for polymerization, cyclohexanone, methylethylketone, benzene, toluene, dioxane, dimethylformamide alone or a combination thereof may be selected. Usually, the polymerization is carried out in the presence of a polymerization initiator, such as benzoylperoxide, 2,2'-azobisisobutyronitrile (AIBN), acetyl peroxide, lauryl peroxide, or t-butylperacetate.

A copolymer of hydroxystyrene, t-butylacrylate and 3-(t-butoxycarbonyl)-1-vinyl-2-caprolactam (hereinafter referred to as "BCVC"), one of the copolymers of the present invention, poly(4-hydroxystyrene-co-t-butyl acrylate-co-BCVC) (hereinafter referred to as "poly(HOST-co-TBA-co-BCVC"), was found to be highly transparent as proven in the experiment in which a film 1 µm thick showed an optical absorbance of 0.12 or lower at deep uv range (200 to 300 nm). Thermal gravity analysis (TGA) showed that poly(HOST-co-TBA-co-BCVC) was stable at up to 180° C. At higher than 180° C., rapid deprotection of t-butoxycarbonyl group occurs, producing 2-methylpropene and CO2 In the presence of acid, the t-butoxycarbonyl group was rapidly deprotected into 2-methylpropene and $CO_2$ even at 135° C. This fact means that poly(HOST-co-TBA-co-BCVC) is far superior in thermal property by virtue of its high thermal decomposition temperature and is readily deprotected at low temperatures in the presence of acid.

Differential scanning calorimetry (DSC) shows that the glass transition temperature of poly(HOST-co-TBA-co-BCVC) is about 165° C.

Besides the transparency to deep uv and the ease of deprotection, a great improvement in PED stability is expected for a novel photoresist containing the copolymer of the present invention by virtue of appropriate photosensitivity and the introduction of the base unit (BCVC). All of the polymers of N-vinyllactam derivatives which are protected at 3-position, are high in sensitivity and contrast. Particularly, poly(HOST-co-TBA-co-BCVC), when BCVC is contained at an amount of 1 mole %, shows an appropriate sensitivity of about 10 mJ/cm$^2$ and a high contrast. As the mole % of BCVC increases, the sensitivity decreases. For example, when BCVC is present in an amount of 2.6 mole %, the resulting copolymer shows a sensitivity of 21 mJ/cm$^2$. However, this decrease in sensitivity is much less serious than those obtainable from the addition of conventional amine base additives.

Ordinary experiment for fine pattern formation confirmed that the copolymers prepared from the N-vinyllactam derivatives and styrenic or acrylate derivatives according to the present invention could be applied for high sensitive chemical amplification resists.

The thermal decomposition behavior analysis of the polymers was carried out in nitrogen atmosphere at a temperature elevation of 10° C./min using DSC, commercially available from Perkin Elmer, identified as MODEL 7, and TGA. The inherent viscosities of the polymers were determined in the state of dimethylformamide solution of 0.5 g/dl at 25° C. by use of a glass capillary tube.

A better understanding of the present invention may be obtained in light of the following examples which are set forth to illustrate, but are not to be construed to limit, the present invention.

EXAMPLE I

Synthesis of 3-(t-Butoxycarbonyl)-1-vinyl-2-pyrrolidinone monomer

To a solution of diisopropylamine 14 ml (100 mmol) in tetrahydrofuran 40 ml free of moisture, 40 ml (100 mmol) of 2.5 M n-butyllithium was added, and the resulting solution was stirred at −78° C. for 30 min and allowed to react until the temperature was elevated up to room temperature. After being freezed down to −78° C., the solution was added with 13.9 g (100 mmol) of N-vinylpyrrolidinone and subjected to reaction at the same temperature for 30 min. Thereafter, 24 g (110 mmol) of di-t-butyl decarbonate was added dropwise, followed by the reaction at −78° C. for 2 hours. This solution was diluted with diethyl ether and washed many times with pure water. The organic solvent of the organic phase was evaporated and the residue was subjected to silica gel column chromatography, to obtain 15 g of pure 3-(t-butoxycarbonyl)-1-vinyl-2-pyrrolidinone (hereinafter referred to as "BCVP"). Its chemical structure was determined by IR spectra and NMR.

EXAMPLE II

Synthesis of 3-(t-Butoxycarbonyl)-1-vinyl-2-caprolactam monomer

To a solution of diisopropylamine 14 ml (100 mmol) in tetrahydrofuran 40 ml free of moisture, 40 ml (100 mmol) of 2.5 M n-butyllithium was added, and the resulting solution was stirred at −78° C. for 30 min and allowed to react until the temperature was elevated up to room temperature. After being freezed down to −78° C. the solution was added with 13.9 g (100 mmol) of N-vinylcaprolactam and subjected to reaction at the same temperature for 30 min. Thereafter, 24 g (110 mmol) of di-t-butyl decarbonate was added dropwise, followed by the reaction at −78° C. for 2 hours. This solution was diluted with diethylether and washed many times with pure water. The organic solvent of the organic phase was evaporated and the residue was subjected to silica gel column chromatography, to obtain 17.2 g of pure 3-(t-butoxycarbonyl)-1-vinyl-2-caprolactam (hereinafter referred to as "BCVC").

IR spectra and NMR analysis were taken to determine the chemical structure of the BCVC synthesized.

EXAMPLE III

Synthesis of 3-(Tetrahydropyranyloxycarbonyl)-1-vinyl-2-pyrrolidinone monomer 10.6 g (0.05 mol) of the BCVP synthesized in Example I was dissolved in 50 ml of tetrahydrofuran free of moisture. To this solution 4.3 g (0.05 mol) of tetrahydropyran and 0.3 g of p-toluene sulfonic acid were added, and allowed to react at 0° C. for 4 hours. The solution was diluted with diethylether and washed many times with pure water. The organic solvent of the organic phase was evaporated and the residue was subjected to silica gel column chromatography, to obtain 9.8 g of. pure 3-(tetrahydropyranyloxycarbonyl)-1-vinyl-2-pyrrolidinone (hereinafter referred to as "TPVP"). Its chemical structure was determined by IR spectra and NMR.

EXAMPLE IV

Synthesis of 3-(Tetrahydrofuranyloxycarbonyl)-1-vinyl-2-pyrrolidinone monomer 8.9 g of 3-(t-butoxycarbonyl)-1-vinyl-2-pyrrolidinone (BCVP) was dissolved in 50 ml of tetrahydrofuran free of moisture. To this solution 1.0 g of sodium hydride and 4.4 g of 2-chlorotetrahydrofuran were added and allowed to react at room temperature for 1 hour. This solution was diluted with diethylether and washed many times with pure water. The organic solvent of the organic phase was evaporated and the residue was subjected to silica gel column chromatography, to obtain 9.3 g of pure 3-(tetrahydrofuranyloxycarbonyl)-1-vinyl-2-pyrrolidinone (hereinafter referred to as "TFVP"). Its chemical structure was determined by IR spectra and NMR.

EXAMPLE V

Synthesis of 3-(Tetrahydropyranyloxycarbonyl)-1-vinyl-2-caprolactam monomer 10.7 g of pure 3-(tetrahydropyranyloxycarbonyl)-1-vinyl-2-caprolactam (hereinafter referred to as "TPVC") was synthesized in a similar manner to that of Example III, except for using 6.7 g of N-vinylcaprolactam instead of BCVP.

IR spectra and NMR analysis were taken to determine the chemical structure of TPVC synthesized.

EXAMPLE VI

Synthesis of 3-(Tetrahydrofuranyloxycarbonyl)-1-vinyl-2-caprolactam monomer

The procedure of Example IV was repeated using 10.3 g of 3-(t-butoxycarbonyl)-1-vinyl-2-caprolactam (BCVC), to obtain pure 10.8 g of pure 3-(tetrahydrofuranyloxycarbonyl)-1-vinyl-2-caprolactam (hereinafter referred to as "TFVC").

IR spectra and NMR analysis were taken to determine the chemical structure of TFVC synthesized.

EXAMPLE VII

Synthesis of poly(HOST-co-TBA-co-BCVC) Copolymer 2.65 g of BCVC monomer synthesized in Example II, 6.0 g of acetoxystyrene and 3.31 g of t-butyl acrylate were dissolved in toluene and placed in a polymerization glass ample. The reactants were polymerized at 65° C. for 22 hours under reduced pressure in the presence of 0.2 mole of AIBN, a polymerization initiator. The polymer was precipitated in petroleum ether and the precipitates were dried to give 8.4 g of poly(ACOST-co-TBA-co-BCVC) copolymer: yield 71%. It was added in a methanol solution containing 12 ml of 28% ammonia water and subjected to base hydrolysis at room temperature for 10 hr with stirring. Neutralization with acetic acid, precipitaion in distilled water, and drying were sequentially carried out to give poly(HOST-co-TBA-co-BCVC). Its inherent viscosity was determined in the state of dimethylformamide solution at 25° C. by use of a ubbelohe type viscometer. The results are given as shown in Table 1 below.

Other copolymers were prepared by using the combinations suggested in Table 1 below. The molar ratios of the units in the copolymers were measured by NMR analysis and thermoanalysis and given in Table 1, along with their viscosities.

glycol methyl ether acetate. In this solution, an onium salt or organic sulfonic acid, acting as a photoacid generator, was added at an amount of 5.0 to 30.0 % by weight based on the weight of the resist polymer. Filtration with ultrafine filter gave a chemical amplification resist solution. Subsequently, it was spin-coated on a silicon wafer, to form a thin film about 1.0 μm thick. This wafer was pre-baked in an oven or hot plate at 120° C. for 1–5 min, exposed to the light radiated from a deep uv contact printer or KrF excimer laser stepper, subjected to post exposure-baking (PEB) in an oven or hot plate at 130 to 150° C. for 1–5 min, and immersed in an alkaline water for 90 seconds for development. As a result, a positive resist pattern of 0.2 μm 1/s was obtained.

Prior to PEB, the exposed resist film was allowed to stand in air for a test for PED stability. Even after 4 hrs, a fine pattern without a T-top formation was obtained.

As described and proven hereinbefore, the novel copolymers which are able to be used as chemical amplification resists suitable for deep uv are successfully synthesized according to the present invention. In addition, the photoresist made of the polymers according to the present invention is of high sensitivity so that patterns can be formed with high resolution.. Furthermore, the introduction of N-vinyllactam derivative brings about a great enhancement in PED stability. Therefore, the radiation-sensitive polymers can be applied for highly integrated semiconductor devices and electronic device lithography. Consequently, ultrafine

TABLE 1

| Polymer | Mole Ratio of Monomers | | | Yield (%) | Inherent Viscosity (dL/g) | Mole Raios of Unit in Polymer | | |
|---|---|---|---|---|---|---|---|---|
| | ACOST: | TBA: | BCVC | | | ACOST: | TBA: | BCVC |
| A | 10 | 7 | 0 | 82 | 0.53 | 62 | 38 | 0 |
| B | 10 | 6 | 0.5 | 80 | 0.51 | 64.3 | 35.0 | 0.7 |
| C | 10 | 6 | 1 | 78 | 0.49 | 63.6 | 35.0 | 1.4 |
| D | 10 | 7 | 3 | 71 | 0.46 | 58.1 | 39.3 | 2.6 |

EXAMPLES VIII THROUGH XIV

Using N-vinylpyrrolidinone (NVP), N-vinylcaprolactam (NVC), BCVP (Example I), TPVP (Example III), TFVP (Example IV), TPVC (Example V) and TFVC (Example VI), the procedure of Example VII was repeated to give respective copolymers. The results are shown in Table 2 below.

circuits can be formed and an exceptional improvement in pattern formation can be attained by using the photoresist prepared according to the present invention.

The present invention has been described in an illustrative manner, and it is to be understood that the terminology used is intended to be in the nature of description rather than of limitation.

TABLE 2

| Polymer | Mole Ratio of Monomers | | | Yield (%) | Inherent Viscosity (dL/g) | Mole Raios of Unit in Polymer | | |
|---|---|---|---|---|---|---|---|---|
| | ACOST: | TBA: | BCVC | | | ACOST: | TBA: | BCVC |
| 8 | 10 | 6 | 3(A) | 84 | 0.43 | 60.2 | 37.0 | 2.8 |
| 9 | 10 | 6 | 3(B) | 82 | 0.51 | 59.3 | 38.0 | 2.7 |
| 10 | 10 | 6 | 3(C) | 78 | 0.45 | 64.1 | 34.0 | 1.9 |
| 11 | 10 | 6 | 3(D) | 75 | 0.47 | 60.9 | 36.7 | 2.4 |
| 12 | 10 | 6 | 3(E) | 80 | 0.50 | 59.3 | 39.0 | 1.7 |
| 13 | 10 | 6 | 3(F) | 78 | 0.48 | 63.1 | 35.0 | 1.9 |
| 14 | 10 | 6 | 3(G) | 77 | 0.48 | 59.7 | 38.7 | 1.6 |

[a]A:NVP, B:NVC, C:BCVP, D:TPVP, E:TFVP, F:TPVC, G:TFVC

EXAMPLE XV

Preparation of Resist Solution and Formation of Positive Fine Pattern 10 to 30 % by weight of poly(HOST-co-TBA-co-BCVC) synthesized in Example VII was dissolved in propylene Many modifications and variations of the present invention are possible in light of the above teachings. Therefore, it is to be understood that within the scope of the appended claims, the invention may be practiced in ways other than those specifically described.

What is claimed is:

1. A phototresist copolymer comprising:
N-vinyllactam derivative blocked by a protecting group represented by the following general Formula II:

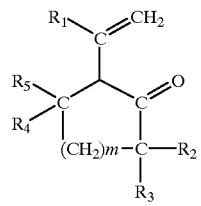

(II)

wherein:
$R_1$ is hydrogen, an alkyl group containing 1 to 10 carbon atoms, or a trialkylsilyl group containing 3 to 9 carbon atoms;

$R_2$ is a protecting group;

$R_3$ is H or the same as $R_2$;

$R_4$ and $R_5$ independently represent —OH, or —OR wherein R is an alkyl group containing 1 to 10 carbon atoms or the same as $R_1$; and m is an integer of 0 to 10;

wherein the protecting group is decomposed by an acid to be a functional group soluble in an alkaline developer.

2. A photoresist copolymer according to claim 1 wherein said functional group soluble in an alkaline developer is carboxylic acid, phenol or alcoholic group.

3. A photoresist copolymer according to claim 1 wherein said protecting group is selected from the group consisting of: an alkyl group containing 1 to 10 carbon atoms; a trialklylsilyl group containing 3 to 9 carbon atoms; —OR', —SO$_3$R', —CO$_2$R', —PO$_3$R', —SO$_2$R', and —PO$_2$R' wherein R' is an alkyl group containing 1 to 10 carbon atoms, cycloalkyl or a cyclic group containing a heteroatom selected from the group consisting of N, O, P and S.

4. A photoresist copolymer according to claim 1 wherein said protecting group is selected from the group consisting of t-butylester, t-butylcarbonate, t-butoxy, t-butoxycarbonyl, tetrahydropyranyloxycarbonyl and tetrahydrofuranyloxycarbonyl.

5. A photoresist copolymer according to claim 1 wherein said N-vinyllactam derivative is selected from the group consisting of:
3-(t-butoxycarbonyl)-1-vinyl-2-pyrrolidinone (BCVP);
3-(t-butoxycarbonyl)-1-vinyl-4-butyl-2-pyrrolidinone;
3-(t-butoxycarbonyl)-1-vinyl-4-propyl-2-pyrrolidinone;
3-(tetrahydropyranyloxycarbonyl)-1-vinyl-2-pyrrolidinone (TPVP);
3-(tetrahydropyranyloxycarbonyl)-1-vinyl-5-ethyl-2-pyrrolidinone;
3-(tetrahydrofuranyloxycarbonyl)-1-vinyl-2-pyrrolidinone (TFVP);
3-(tetrahydrofuranyloxycarbonyl)-1-vinyl-4-butyl-2-pyrrolidinone;
3-(t-butoxycarbonyl)-1-vinyl-4-methyl-2-piperidone;
3-(t-butoxycarbonyl)-1-vinyl-4-propyl-2-piperidone;
3-(t-butoxycarbonyl)-1-vinyl-2-caprolactam (BCVC);
3-(t-butoxycarbonyl)-1-vinyl-4-butyl-2-caprolactam;
3-(t-butoxycarbonyl)-1-vinyl-6-methyl-2-caprolactam;
3-(tetrahydropyranyloxycarbonyl)-1-vinyl-2-caprolactam (TPVC);
3-(tetrahydropyranyloxycarbonyl)-1-vinyl-5-butyl-2-caprolactam;
3-(tetrahydropyranyloxycarbonyl)-1-vinyl-6-propyl-2-caprolactam;
3-(tetrahydropyranyloxycarbonyl)-1-vinyl-6-butyl-2-caprolactam;
3-(tetrahydrofuranyloxycarbonyl)-1-vinyl-2-caprolactam (TFVC).

6. A photoresist copolymer according to claim 1 wherein said copolymer further comprises styrenic or acrylate derivatives.

7. A photoresist copolymer according to claim 6 wherein said styrenic and acrylate derivative independently contains hydroxylalkyl group(s) or protecting group(s).

8. A photoresist copolymer according to claim 6 wherein said styrenic derivative is hydroxystyrene (HOST).

9. A photoresist copolymer according to claim 6 wherein said acrylate derivative is t-butylacryalte (TBA).

10. A photoresist copolymer according to claim 1, wherein said copolymer is represented by Formula I:

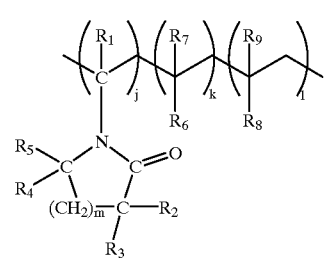

I wherein:
$R_1$ is hydrogen, an alkyl group containing 1 to 10 carbon atoms, or a trialkylsilyl group containing 3 to 9 carbon atoms;

$R_2$ is a protecting group wherein the protecting group is decomposed by an acid to be a functional group soluble in an alkaline developer;

$R_3$ is H or the same as $R_2$;

$R_4$ and $R_5$ independently represent —OH, —OR wherein R is an alkyl group containing 1 to 10 carbon atoms or is the same as $R_1$; and $R_7$ and $R_9$ independently represent hydrogen, an alkyl group containing 1 to 10 carbon atoms, or a trialkylsilyl group containing 3 to 9 carbon atoms;

$R_6$ and $R_8$ independently represent an aryl group containing hydroxyalkyl group(s) or protecting group(s);

m is an integer of 0 to 10;

j is a molar ratio ranging from 0.005 to 0.7; and k and l, which can be the same or different, each have a molar ratio ranging from 0.05 to 0.9.

11. A photoresist copolymer according to claim 1, wherein said copolymer is selected from the group consisting of:
Poly(HOST-co-TBA-co-BCVC);
Poly(HOST-co-TBA-co-BCVP);
Poly(HOST-co-TBA-co-TPVP); and
Poly(HOST-co-TBA-co-TFVP.

12. A method for preparing a photoresist copolymer represented by the following general Formula I which comprises the steps of:

(a) dissolving in an organic solvent (i) N-vinyllactam derivatives represented by the following general Formula II and (ii) styrenic or acrylate derivatives; and (b) adding a polymerizing initiator into the resultant solution;

(II)

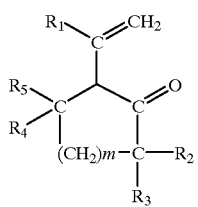

wherein:
R₁ is hydrogen, an alkyl group containing 1 to 10 carbon atoms, or a trialkylsilyl group containing 3 to 9 carbon atoms;
R₂ is a protecting group;
R₃ is H or the same as R₂;
R₄ and R₅ are independently —OH, —OR wherein R is an alkyl group containing 1 to 10 carbon atoms or the same as R₁;
m is an integer of 0 to 10;
wherein the protecting group is decomposed by an acid to be a functional group soluble in an alkaline developer

I

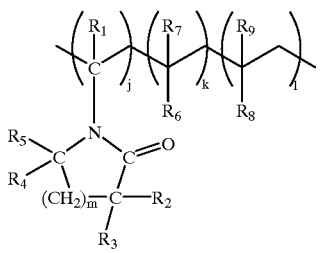

wherein:

R₁ is hydrogen, or an alkyl group containing 1 to 10 carbon atoms, or a trialkylsilyl group containing 3 to 9 carbon atoms;

R₂ is a protecting group wherein the protecting group is decomposed by an acid to be a functional group soluble in an alkaline developer;

R₃ is H or the same as R₂;

R₄ and R₅ independently represent —OH, —OR wherein R is an alkyl group containing 1 to 10 carbon atoms or is the same as R₁; and R₇ and R₉ independently represent hydrogen, an alkyl group containing 1 to 10 carbon atoms, or a trialkylsilyl group containing 3 to 9 carbon atoms;

R₆ and R₈ independently represent an aryl group containing hydroxyalkyl group(s) or protecting group(s);

m is an integer of 0 to 10;

j is a molar ratio ranging from 0.005 to 0.7; and k and l which can be the same or different, each have a molar ratio ranging from 0.05 to 0.9.

13. A method according to claim 12 wherein said polymerization initiator is selected from the group consisting of benzoylperoxide, 2,2'-azobisisobutronitrile (AIBN), acetyl peroxide, lauryl peroxide, and t-butylperacetate.

14. A method according to claim 12, wherein said organic solvent is selected from the group consisting of cyclohexanone, methylethylketone, benzene, toluene, dioxane, dimethylformamide, and mixtures thereof.

* * * * *